United States Patent [19]

Yerkovich

[11] 3,755,612

[45] Aug. 28, 1973

[54] STRUCTURAL SUPPORTS PROVIDING SHIELDING AGAINST INTERFERENCE

[75] Inventor: Simon Yerkovich, Los Angeles, Calif.

[73] Assignee: Litton Systems, Inc., Beverly Hills, Calif.

[22] Filed: Mar. 6, 1972

[21] Appl. No.: 231,968

[52] U.S. Cl. .......... 174/35 MS
[51] Int. Cl. .......... H05k 9/00
[58] Field of Search .......... 174/35 R, 35 GC, 174/35 MS, 51; 317/121

[56] References Cited

UNITED STATES PATENTS

| | | | |
|---|---|---|---|
| 1,765,443 | 6/1930 | Peterson | 174/35 GC |
| 2,604,507 | 7/1952 | Tyson | 174/35 GC |
| 938,811 | 11/1909 | Baker | 317/121 X |
| 2,978,531 | 4/1961 | Appleman | 174/35 MS |

*Primary Examiner*—Bernard A. Gilheany
*Assistant Examiner*—D. A. Tone
*Attorney*—Robert M. Angus et al.

[57] ABSTRACT

A structure is provided for supporting and shielding electrical apparatus. A metallic plate member is fastened to another metal member by suitable fasteners. The plate member is deformed in a region adjacent an edge portion thereof so that the edge portion grips the metal of the other member in interference relationship. The deformation of the region of the plate is to such degree that the elastic limit of the plate is not exceeded so that the plate continuously bears against such other member.

9 Claims, 10 Drawing Figures

PATENTED AUG 28 1973

3,755,612

STRUCTURAL SUPPORTS PROVIDING SHIELDING AGAINST INTERFERENCE

The invention herein described was made in the course of or under a contract or subcontract thereunder, (or grant) with the United States Army.

This invention relates to shielding techniques, and particularly to apparatus for shielding against radio frequency interference, electro-magnetic interference and electro-magnetic pulsation.

Heretofore, electrically conductive enclosures, such as cabinets, transit cases, shelters and the like, have been utilized to shield electronic equipment from interference against radio frequency radiation, electro-magnetic radiation and electro-magnetic pulsation. The enclosures have been useful for structural support for the electronic equipment housed therein. Heretofore, the panels and structural components of such enclosures have been fastened together, such as by welding and/or riveting, to shield electronic equipment against various types of interference radiation. However, riveted members have not exhibited the most desirable shielding characteristics, whereas the welding of members tended to heat treat the joined parts to thereby weaken the structure. Hence, enclosures fastened by rivets have not exhibited the shielding characteristics of welded enclosures, whereas the welding of enclosures can cause structural and fabrication complications.

It is an object of the present invention to provide shielding apparatus in which the component parts are joined together in an interference fit to provide reliable shielding against radio frequency interference, electro-magnetic interference, and electro-magnetic pulsation.

It is another object of the present invention to provide an enclosure for shielding against interfering radiation wherein the individual components of the enclosure are joined together in an interference fit, held together by fasteners.

In accordance with the present invention, an enclosure is provided for shielding against interference radiation. The component members of the enclosure are joined together in an interference fit by flexing at least one of the members to such extent that the elastic limit of the member is not exceeded, and by fastening the members together to form an interference fit along the seam between them.

According to one feature of the present invention, ordinary sheet metal, such as sheet aluminum, is pre-shaped so that when the sheet metal is fastened to more rigid member, such as a frame forming an end structural member of the enclosure, the sheet metal grips the metal of the rigid member to form an interference fit therewith.

In accordance with yet another feature of the present invention, two sheet metal members may be joined by flexing one or both members and fastening the members together at a region between or adjacent the flexing so that the edge portions of one or both sheet metal members grip the other to form an interference fit.

The above and other features of this invention will be more fully understood from the following detailed description and the accompanying drawings, in which.

Figures 1, 2, 3, 4:
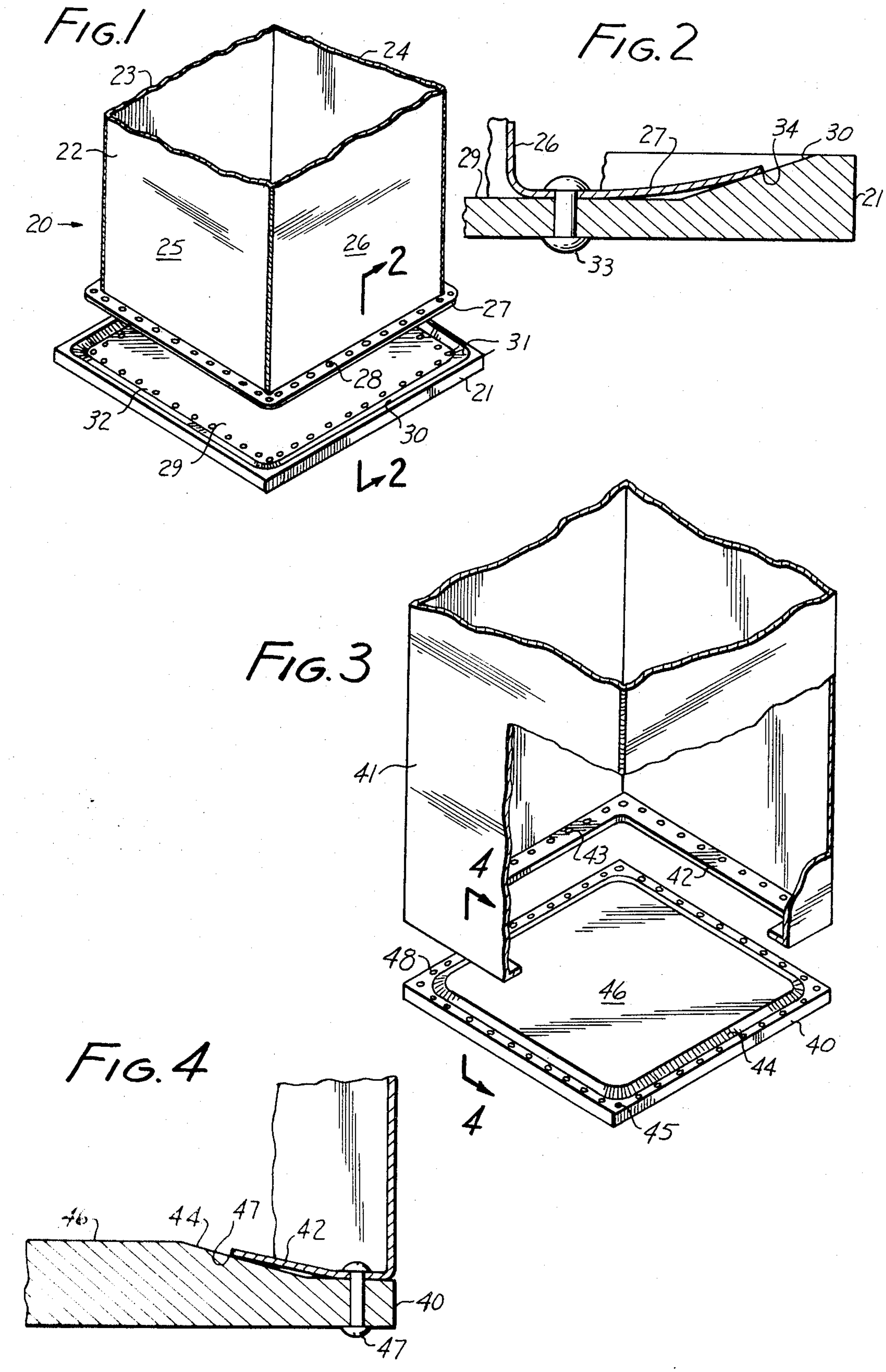
FIG. 1 is an exploded perspective view of a portion of an enclosure in accordance with the presently preferred embodiment of the present invention.
FIG. 2 is a section view of a portion of the enclosure illustrated in FIG. 1, taken at line 2—2 in FIG. 1.
FIG. 3 is an exploded perspective view of a portion of an enclosure in accordance with a modification of the present invention.
FIG. 4 is a section view of a portion of the enclosure illustrated in FIG. 3, taken at line 4—4 in FIG. 3.

Referring to FIG. 1, there is illustrated an enclosure 20 in accordance with the presently preferred embodiment of the present invention. Enclosure 20 includes a rigid metallic member 21 forming an end portion for the enclosure and side member 22 forming the sides of the enclosure. Member 22 may, for example, comprise a plurality of sheet aluminum panels, 23, 24, 25 and 26, each having a thickness of between about 0.03 and one-fourth inches and welded together to form a structural member. Each of plates 23–26 includes an outwardly extending flange portion 27 having apertures 28 adapted to match apertures 32 in member 21.

Member 21 includes a substantially flat surface 29 forming an inside end interface surface of the enclosure. Inclined surface 30 is disposed at an angle to surface 29 to extend outwardly and upwardly from surface 29 to terminate near an edge of member 21. As illustrated in FIG. 1, incline surface 30 is preferably curved at the corners so as to form a substantially continuous inclined surface. Apertures 32 are provided in the region of surface 29 so that rivets 33 extend through apertures 28 and 32 to fasten members 22 and 21 together.

As illustrated in FIG. 2, the heads of rivets 33 fasten flange 27 contiguous to surface 29 of member 21 so that the edge portion 34 grips surface 30 of member 21 to form an interference fit between the members. Flange 27 is bent in the region between edge 34 and rivets 33 to a degree not exceeding the elastic limit of the plate. Hence, resilience is retained in the flange so that a constant pressure is applied to the edge portion so that an adequate shield is provided at the junction.

FIGS. 3 and 4 illustrate a modification of an enclosure in accordance with the present invention wherein a rigid metallic member 40 forms an end portion for the enclosure and member 41 comprises the structural side portions of the enclosure. Member 41 may comprise a plurality of deformable aluminum plates welded together to form a shielded enclosure having an inwardly directed flange 42 containing a plurality of apertures 43. Member 40 includes an inclined surface 44 extending upwardly and inwardly from planar surface 45 at the bounds of member 40. Planar surface 46 forms the inside end surface of the enclosure. Rivets 47 extend through apertures 43 and 48 to fasten members 40 and 41 together so that the flange portion 42 is contiguous to surface 45 and edge portion 47 of flange 42 grips surface 44 in an interference relationship. The flange is flexed to a degree not exceeding the elastic limit of the metal to assure a constant gripping pressure.

Figure 5:
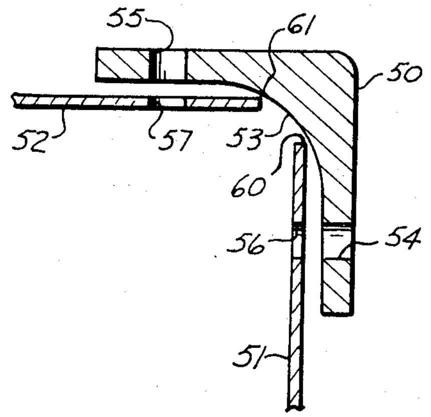
FIG. 5 is an exploded assembly view, in cutaway cross-section, of a portion of another enclosure in accordance with another modification of the present invention.
Figure 6:
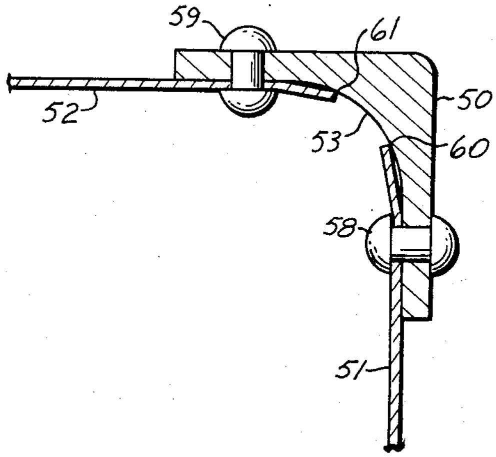
FIG. 6 is a section view, as in FIG. 5, showing the completed assembly of the portion shown in FIG. 5.

FIGS. 5–8 illustrate the manner by which plates may be fastened to rigid extrusions in interference relationship. By way of example, the extrusions may comprise frame portions for an enclosure to which the panels or plates are fastened. As illustrated in FIGS. 5 and 6, extrusion 50 may comprise a suitable metallic right-angle extrusion. Panels 51 and 52 are preferably constructed of suitable sheet aluminum. Extrusion 50 includes a concave inner surface 53 whereas sheets 51 and 52 are substantially planar. Apertures 54 and 55 are provided in the separate legs of extrusion 50 and apertures 56 and 57 are provided in sheets 51 and 52, respectively. Rivets 58 and 59 fasten plates 51 and 52 to extrusion 50 through the apertures 54–57 so that the heads of rivets 58 and 59 bear against opposite planar surfaces of the extrusion and the mating plate. Edges 60 and 61 of plates 51 and 52 grip the metal of extrusion 50 at the curved surface 53 to bend plates 51 and 52 to a degree which does not exceed the elastic limit of the plates. Hence, the resilience retained in the plates assures that a constant pressure is applied between the mated parts to assure proper shielding of the junction.

Figures 7, 8:
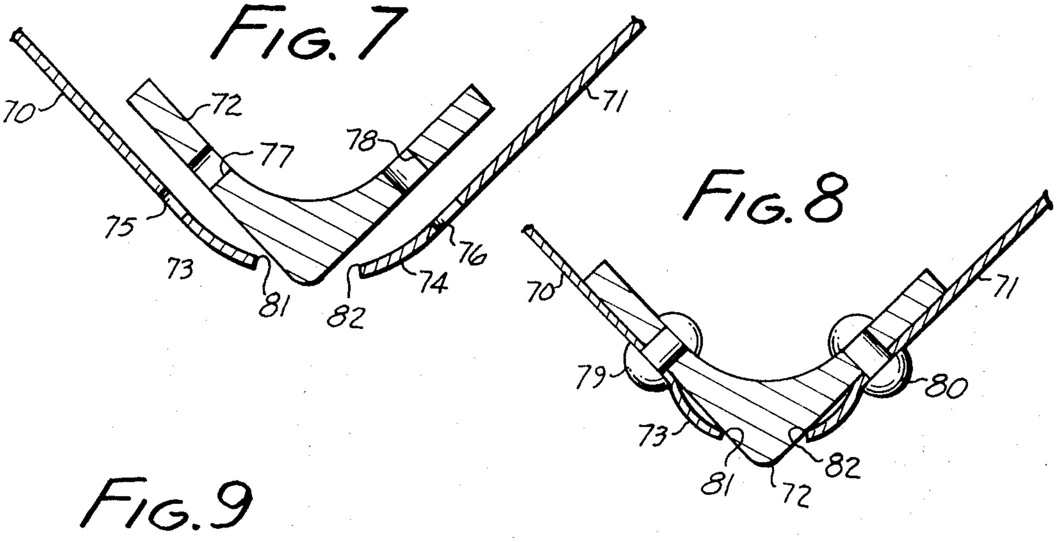
FIG. 7 is an exploded assembly view, in cutaway cross-section, of a portion of another modification of the enclosure according to the present invention.
FIG. 8 is a section view, as in FIG. 7, of the completed assembly of the portion shown in FIG. 7.

FIGS. 7 and 8 illustrate the manner by which plates 70 and 71 may be fastened to the outside of a right-angle extrusion 72. Plates 70 and 71 are bent at regions 73 and 74, respectively, beyond the respective elastic limit of the plates. Apertures 75 and 76 are provided in plates 70 and 71, respectively, to match apertures 77 and 78 in extrusion 72. Rivets 79 and 80 fasten plates 70 and 71 to extrusion 72 through apertures 75–78 so that the heads of rivets 79 and 80 bear against opposite planar surfaces of the extrusion and the mating plates. Regions 73 and 74 of plates 70 and 71 bend to a degree which does not exceed the elastic limits of the plates so that edges 81 and 82 grip the planar surfaces of extrusion 72 in interference relationship. Hence, the resilience retained in the plates assures that a constant gripping pressure is applied between the mated parts to assure proper shielding to the joint.

Figure 9:
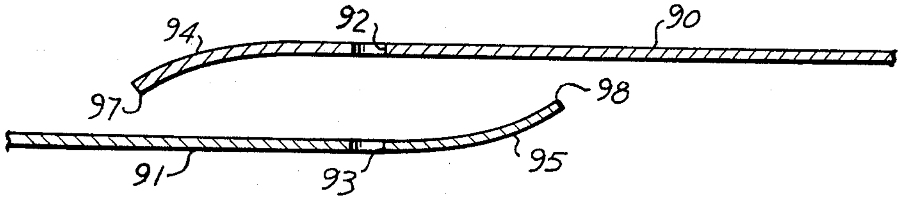
FIG. 9 is an exploded assembly view, in cutaway cross-section, showing the assembly of two plates in accordance with a modification of the present invention.
Figure 10:
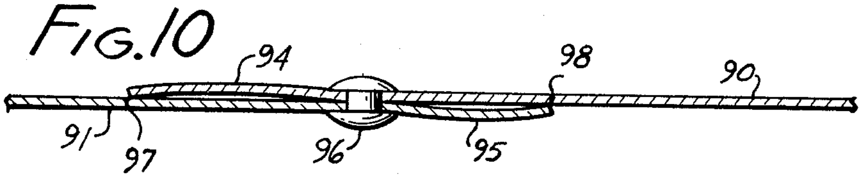
FIG. 10 is a section view, as in FIG. 9, of the assembled plates shown in FIG. 9.

FIGS. 9 and 10 illustrate yet another joint between mating planar plates 90 and 91. Apertures 92 and 93 are provided in the respective plates, and each plate includes a region 94 and 95 which is disposed at an angle or radius to the plane of the respective plate. Rivet 96 fastens plates 90 and 91 together through apertures 92 and 93 so that the head of rivet 96 bears against opposite planar surfaces of plates 90 and 91 to match the planar surfaces of the plates together. Edge 97 of plate 90 grips the metal of plate 91, and edge 98 of plate 91 grips the metal of plate 90. The plates are fastened together to bend regions 94 and 95 to a degree which does not exceed the elastic limit of the plates so that resilience is retained in the plate at regions 94 and 95 to assure constant gripping of the plates.

In each case where an angle surface of a sheet is intended to grip or "bite" into another member, it is preferred that the edge surface be sufficiently sharp as to enable the edge surface to establish a good electrical contact between the joined member along the entire length of the seam. Thus, the edge surface will cut or break through an otherwise insulative oxide film on the member to establish good electrical connection for adequate shielding purposes. Tension imposed on the edge surface by the fasteners and the resilience of the plate assures maintenance of electrical contact along the joint.

The present invention thus provides shielding techniques for electrically conductive enclosures which do not require welding or other heat treating fastening techniques. The resultant structure exhibits relatively high mechanical strength and provides shielding against interference from radio frequency radiation, electro-magnetic radiation, and electro-magnetic pulsation. The apparatus is effective in use and provides a rugged structure which is easily fabricated.

This invention is not to be limited by the embodiments shown in the drawings and described in the description, which are given by way of example and not of limitation, but only in accordance with the scope of the appended claims.

What is claimed is:

1. A structure for housing apparatus comprising: a metallic member; a metallic plate means, said metallic member and said plate means each having a substantially planar first surface and one of said metallic member and said plate means having a second surface inclined from the plane of its said first surface toward the other of said metallic member and said plate means; and at least one fastener means bearing against said plate means and said metallic member to maintain said first surfaces contiguous and to bend a region of said plate means to a degree not exceeding the elastic limit of said plate means, said plate means having an edge portion, said edge portion gripping said metallic member in an interference relationship to establish electrical connection between said metallic member and said plate means along the entire length of said edge portion, whereby said structure shields said electronic apparatus from radio frequency interference, electromagnetic interference, and electro-magnetic pulsation.

2. The structure according to claim 1 wherein said metallic member is a rigid member and said plate means includes flange means containing said region and said planar first surface, said rigid member including said first planar surface substantially parallel to said first surface of said flange means and including said second inclined surface disposed at an angle to said first surface of said rigid member, said fastener means fastening said flange means to said first surface of said rigid member so that edge portion grips said second surface of said rigid member.

3. The structure according to claim 2 wherein said plate means defines at least one side portion of an enclosure and said flange means protrudes outwardly from said enclosure at one end thereof, said first surface of said rigid member defining an end surface for said enclosure, and said second surface of said rigid member being inclined upwardly and outwardly from said first surface of said rigid members.

4. The structure according to claim 2 wherein said plate means defines at least one side portion of an enclosure and said flange means protrudes into said enclosure at one end thereof, said rigid member being sized as to close said end of said enclosure with said first surface of said rigid member bounding the region of said enclosure, said second surface of said rigid member being inclined upwardly and inwardly from said first surface of said rigid member.

5. The structure according to claim 1 wherein said metallic member is a rigid member and wherein said rigid member includes said second surface inclined with respect to its said first surface, said fastener means bearing against said plate means and said rigid member to maintain said first surfaces contiguous, a region of said plate means bending to a degree not exceeding its elastic limit to cause an edge portion of said plate means to grip said second surface of said rigid member in an interference relationship.

6. The structure according to claim 5 wherein said rigid member further includes a substantially planar third surface and a fourth surface inclined with respect to its said third surface and further including a second plate means having a substantially planar first surface and further including second fastener means bearing against said second plate means and said rigid member to maintain said planar third surface of said rigid member contiguous to said first planar surface of said second plate means, a region of said second plate means bending to a degree not exceeding its elastic limit to cause an edge portion of said second plate means to grip said fourth surface of rigid member in an interference relationship.

7. The structure according to claim 1 wherein said metallic member is a rigid member and said plate means includes said second surface inclined with respect to its said first planar surface, said fastener means bearing against said plate means and said rigid member to maintain said first surfaces contiguous, a region of said plate means bending to a degree not exceeding its elastic limit to cause an edge portion of said plate means to grip said planar first surface of said rigid member in an interference relationship.

8. The structure according to claim 7 wherein said rigid member further includes a substantially planar third surface and further including a second plate means having a substantially planar first surface and having a second surface inclined with respect to its said first surface, and further including second fastener means bearing against said second plate means and said rigid member to maintain said planar third surface of said rigid member contiguous to said planar first surface of said second plate means, a region of said second plate means bending to a degree not exceeding its elastic limit to cause an edge portion of said second plate means to grip said third surface of said rigid member in an interference relationship.

9. The structure as claimed in claim 1 wherein said plate means includes said second surface disposed at an angle with respect to its planar said first surface and wherein said metallic member comprises a second plate means including said substantially planar first surface and having a second surface disposed at an angle with respect to said first surface of said second plate means, said fastener means bearing against said plate means and said second plate means to maintain said first surfaces contiguous and to bend a region in said second plate means and to a degree not exceeding its elastic limit, said second plate means having an edge portion, said edge portion of said second plate means gripping said plate means in an interference relationship, and said edge portion of said plate means gripping said second plate means in an interference relationship.

* * * * *